United States Patent [19]
Kanayama et al.

[11] Patent Number: 6,117,617
[45] Date of Patent: Sep. 12, 2000

[54] PATTERNING METHOD UTILIZING ELECTRON BEAM RESIST CONTAINING METHANOFULLERENE COMPOUND

[75] Inventors: Toshihiko Kanayama, Tsuchiura; Tetsuya Tada, Tsukuba, both of Japan; Richard Edward Palmer, Stourbridge; Alexander Phillip Robinson, Andover, both of United Kingdom

[73] Assignees: Japan as represented by Director of Agency of Industrial Science and Technology, Tokyo-to, Japan; The University of Birmingham, Birmingham, United Kingdom

[21] Appl. No.: 09/157,103

[22] Filed: Sep. 18, 1998

[30] Foreign Application Priority Data

Sep. 22, 1997 [JP] Japan .................................. 9-257122

[51] Int. Cl.$^7$ ...................................................... G03C 5/00
[52] U.S. Cl. ............................................ 430/296; 430/942
[58] Field of Search ...................................... 430/296, 942

[56] References Cited

U.S. PATENT DOCUMENTS 5,561,026  10/1996  Aoki ........................................ 430/942

FOREIGN PATENT DOCUMENTS

| 6-19136 | 1/1994 | Japan . |
| 6-167812 | 6/1994 | Japan . |
| 7-33751 | 2/1995 | Japan . |
| 7-134413 | 5/1995 | Japan . |
| 9-211862 | 8/1997 | Japan . |

*Primary Examiner*—Christopher G. Young
*Attorney, Agent, or Firm*—Wenderoth, Lind & Ponack, LLP

[57] ABSTRACT

A high-resolution patterning method of a resist layer is disclosed by patternwise irradiation of the resist layer with electron beams utilizing a methanofullerene compound as the electron beam resist material, which is graphitized and made insoluble in an organic solvent by the electron beam irradiation in a dose of, for example, $1 \times 10^{-4}$ C/cm$^2$ or larger. The thus formed resist layer is highly resistant against dry etching to ensure utilizability of the method in the fine patterning work for the manufacture of semiconductor devices.

7 Claims, 4 Drawing Sheets

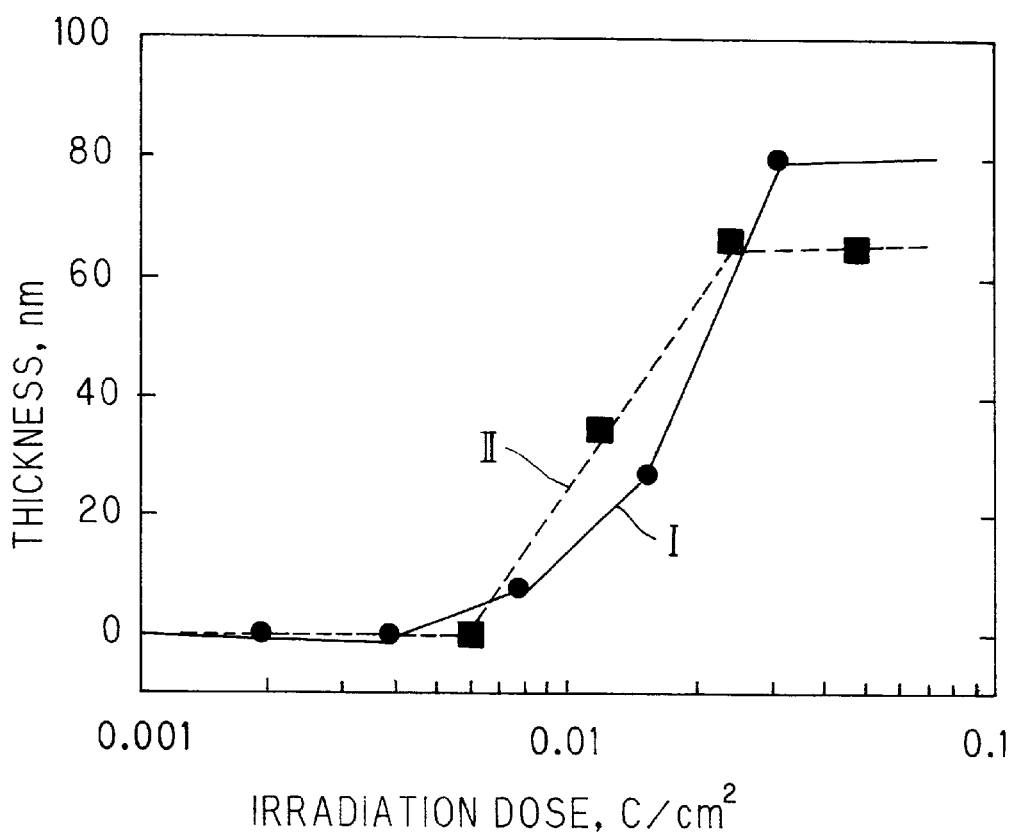

PATTERNING METHOD UTILIZING ELECTRON BEAM RESIST CONTAINING METHANOFULLERENE COMPOUND

BACKGROUND OF THE INVENTION

The present invention relates to an electron beam resist material and a method for forming a finely patterned resist layer on a substrate surface by using the electron beam resist material. In particular, the inventive method utilizes a quite unique compound not used heretofore for the purpose of fine patterning of a resist layer in the field of electronic industries.

As is well known, the manufacturing process of various kinds of electronic or semiconductor devices such as ICs, LSIs and the like involves a fine patterning of a resist layer on the surface of a substrate material such as a semiconductor silicon wafer. This fine patterning process is conducted heretofore by the photolithographic method in which the substrate surface is uniformly coated with a positive- or negative-tone photoresist composition to form a thin layer of the photoresist composition and patternwise irradiating the photoresist layer with actinic rays such as ultraviolet light followed by a development treatment to selectively dissolve away the photoresist layer in the areas exposed or unexposed, respectively, to the actinic rays leaving a patterned resist layer on the substrate surface. The thus obtained patterned resist layer is utilized as a masking in the subsequent treatment on the substrate surface such as etching.

While the above mentioned patternwise exposure of the resist layer is conducted traditionally with ultraviolet light, it is a trend in recent years that, along with the rapid progress of the electronic technology toward higher and higher degrees of integration in semiconductor devices, the patterning of the resist layer is required to have more and more increased fineness which can be accomplished only by using actinic rays having a shorter wavelength than the conventional ultraviolet light. Accordingly, it has now come into sight that, in place of the conventional ultraviolet light, electron beams, excimer laser beams and X-rays are used as the short-wavelength actinic rays.

As the principal ingredient in a resist material having sensitivity to electron beam irradiation, referred to as an EB resist hereinafter, proposals have been made heretofore for the use of an organic resinous material such as methacrylic resin-based, polystyrene-based and novolak resin-based ones. In the polystyrene-based negative-tone EB resist materials, for example, patterning of the resist layer is accomplished by the mechanism that irradiation of the resist layer with electron beams induces crosslinking or polymerization of the resin molecules so that the resist layer is made insoluble in a developer solution in the areas patternwise irradiated with the electron beams leaving a patterned resist layer on the substrate surface so that, as a natural consequence, the fineness of patterning cannot be finer than the molecular dimensions of the resinous ingredient. In the novolak resin-based EB resist materials utilizing the changes in the solubility behavior of the resist layer in an alkaline developer solution caused by the patternwise irradiation with electron beams, the molecular size of the resinous ingredient is the limiting factor on the fineness of patterning since dissolution of the resist layer in the developer solution proceeds with resin molecules as the dissolving units. Thus, it is accepted in the prior art that resolution of patterning cannot be finer than several tens of nanometers at the best because the molecules of the above mentioned resins mostly have a molecular size of at least a few nanometers. In the so-called chemical amplification type resist materials recently under development, furthermore, the patterning of the resist layer utilizes the mechanism involving diffusion of the reactive species generated by the irradiation through the resist layer, it is far from possible to obtain pattern resolution in the ten-nanometer order or finer. Accordingly, it is eagerly desired to develop an EB resist capable of giving a high pattern resolution of nanometer order fineness which would not be obtained with the above described prior art EB resist systems.

In the methacrylic resin-based positive-tone EB resist materials, on the other hand, the pattern resolution is not always under limitation by the molecular size of the resinous ingredient because the patterning of the resist layer is effected by the main chain scission of the resin molecules by the irradiation with electron beams so that a pattern resolution of fineness of about 10 nm has already been obtained but the effective fineness of the working resist layer cannot be so high because the resistance of the resist layer against dry etching is relatively poor so that the patterned resist layer cannot be used as formed as a masking resist against etching.

It would be a due guide principle therefore that the above mentioned defects and problems in the prior art EB resist materials could be overcome when the EB resist comprises, as the principal ingredient, a compound of a nanometer order molecular size having sensitivity to electron beam irradiation and capable of giving a layer having excellent resistance against dry etching.

SUMMARY OF THE INVENTION

The present invention, which has been completed as a result of the inventors' extensive investigations undertaken along the lines of the above mentioned guide principle, has an object to provide a novel EB resist composition as well as a method for the formation of a finely patterned resist layer on a substrate surface utilizing the novel EB resist material by the patternwise irradiation of the resist layer with electron beams.

Thus, the novel EB resist composition provided by the invention comprises:

(A) an organic solvent; and (B) a methanofullerene compound having one or more of adduct groups in the molecule dissolved in the organic solvent.

Further, the method of the present invention for the formation of a patterned resist layer on a substrate surface by patternwise irradiation with electron beams comprises the steps of:

(a) coating the substrate surface with a solution of a methanofullerene compound having one or more of adduct groups in the molecule dissolved in an organic solvent to form a coating layer;

(b) evaporating the organic solvent from the coating layer to form a dried coating layer containing the methanofullerene compound;

(c) irradiating the dried coating layer patternwise with electron beams; and (d) dissolving away the coating layer with an organic solvent from the areas unirradiated with the electron beams.

BRIEF DESCRIPTION OF THE DRAWING

FIG. 5 is a graph showing the film thickness retention after development as a function of the irradiation dose with electron beams determined in Comparative Example.

DETAILED DESCRIPTION OF THE PREFERRED EMBODIMENTS

Figure 1:
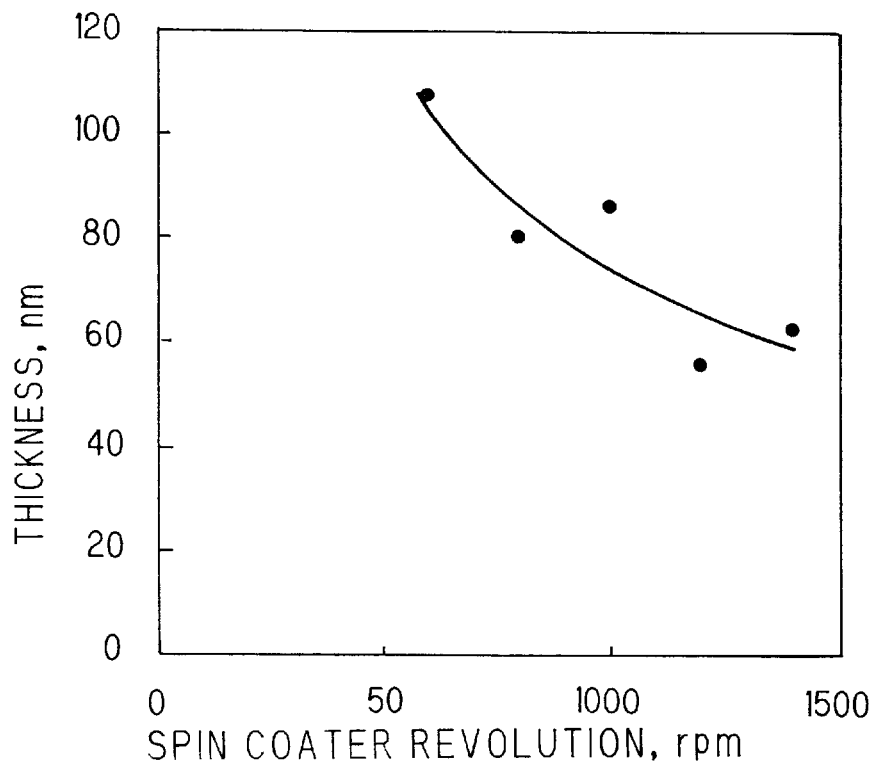
FIG. 1 is a graph showing the thickness of the coating layer formed by spin coating as a function of the velocity of spin coater revolution determined in Example 1.

As a result of the extensive investigations undertaken with the above mentioned object, the inventors have arrived at an idea that a $C_{60}$ fullerene compound having a molecular size not exceeding 1 nm would meet the above mentioned requirements for the high patterning resolution because this compound is made insoluble in an organic solvent by the irradiation with electron beams. This compound, however, is not practically feasible because the sensitivity thereof to electron beam irradiation is so low as to be in the order of $10^{-2}$ C/cm² taking an unduly long time for patterning and a solution of the compound in an organic solvent usually has a viscosity so low that the quality of the coating layer formed from the solution by the spin coating method cannot be good enough for fine patterning necessitating application of other elaborate methods such as the vacuum evaporation method.

In view of the above described problems and disadvantages in the use of a conventional fullerene compound as the principal ingredient of an EB resist, the inventors have undertaken extensive investigations arriving at a quite unexpected discovery that the above described problems and disadvantages could be overcome by the use of, in place of a conventional fullerene compound, a specific methanofullerene compound having one or more of adduct groups in the molecule since this compound having a molecular size of around 1 nm or smaller is soluble in an organic solvent but can be made insoluble by the irradiation with electron beams with a practicable high sensitivity and the solution of the compound in an organic solvent may have an adequately high viscosity to ensure good workability in spin coating.

As is known, fullerene is a compound having a molecular configuration of a spherical shell or ball crust composed of a three-dimensional network of pentagonal and hexagonal ring structures of carbon atoms including $C_{60}$ fullerenes, $C_{70}$ fullerenes and still higher compounds, most of which are soluble in various kinds of organic solvents, having a molecular size mostly not exceeding 1 nm.

The specific methanofullerene compound used as the principal ingredient of the EB resist in the present invention is obtained by a chemical modification reaction of these fullerene compounds to introduce one or more of adduct groups into the molecule according to the disclosure in, for example, Science, volume 271, page 317 (Jan. 19, 1996). Such a methanofullerene compound having one or more of adduct groups is expressed by the perspective general structural formulas (1A) to (1D) given below depending on the fashion in which the adduct groups are bonded to the shell structure of the fullerene molecule:

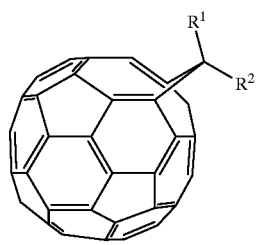
(1A)

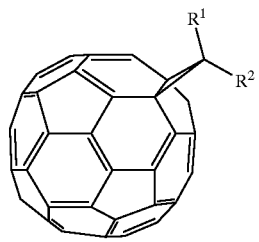
(1B)

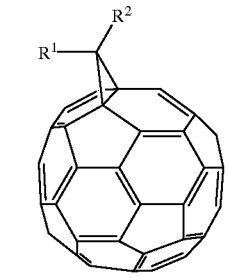
(1C)

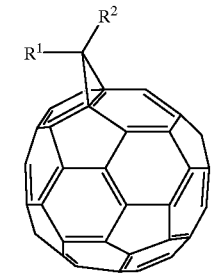
(1D)

in which $R^1$ and $R^2$ are each, independently from the other, a monovalent organic group or, alternatively, a divalent organic group jointly forming a ring structure or forming a ring structure jointly with the carbon atoms forming the fullerene shell. The compounds expressed by the formulas (1A) to (1D) are each an isomer to the others. It is not always necessary in the present invention to use a particular isomer of the methanofullerene compound isolated from the others but any combinations of these isomers can be used as such. Further, while the above given formulas indicate those molecules having a single crosslink by the adduct groups, two or more of crosslinks can be provided to a single spherical fullerene molecule. While the formulas (1A) to (1D) illustrate the molecular structures derived from the $C_{60}$ fullerene compound, needless to say, those derived from other fullerene compounds can be used equally in the present invention although $C_{60}$ fullerene compounds are preferable in the present invention due to the smallest molecular size to give excellent pattern resolution.

The above described methanofullerene compounds can be easily prepared by a known method, for example, by conducting the reaction of a fullerene compound dissolved in toluene with diazomethane. Methanofullerene compounds are generally stable against thermal decomposition at a temperature not exceeding 250° C. Methanofullerene compounds usually have a solubility in various organic solvents larger than the solubility of the corresponding unmodified fullerene compound in the same solvent.

It is presumable that the sensitivity of a fullerene compound to electron beam irradiation is enhanced when the fullerene compound is converted to a methanofullerene due to the substantial strain of the shell structure of the molecule. This is a quite unique characteristic of the methanofullerene compounds not found in other fullerene derivatives such as the Diels-Alder adducts expressed by the perspective structural formulas (2A) to (2C) shown below:

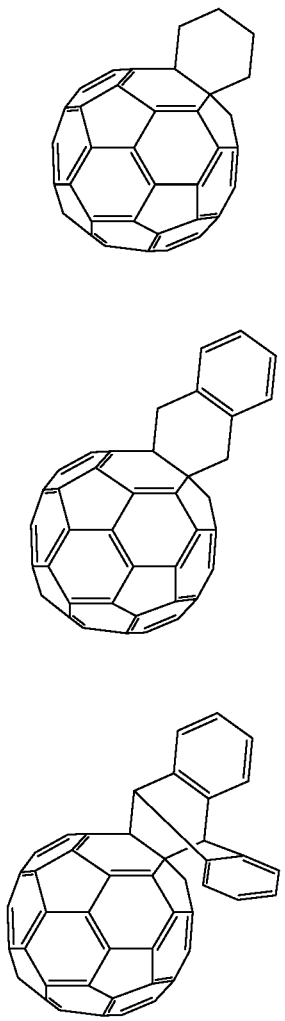

When one or both of the organic adduct groups represented by $R^1$ and $R^2$ in the formulas (1A) to (1D) have an oxygen atom, in addition, an increase is caused in the localization of the electric charges so that the sensitivity of the methanofullerene compound to electron beam irradiation can be further improved. Additionally, an oxygen atom has an advantageous characteristic of substitution for a carbon atoms so as to directly form a adduct group.

Particular examples of the methanofullerene compounds suitable for use in the present invention include those expressed by the following molecular formulas and structural formulas (3A) to (3H):

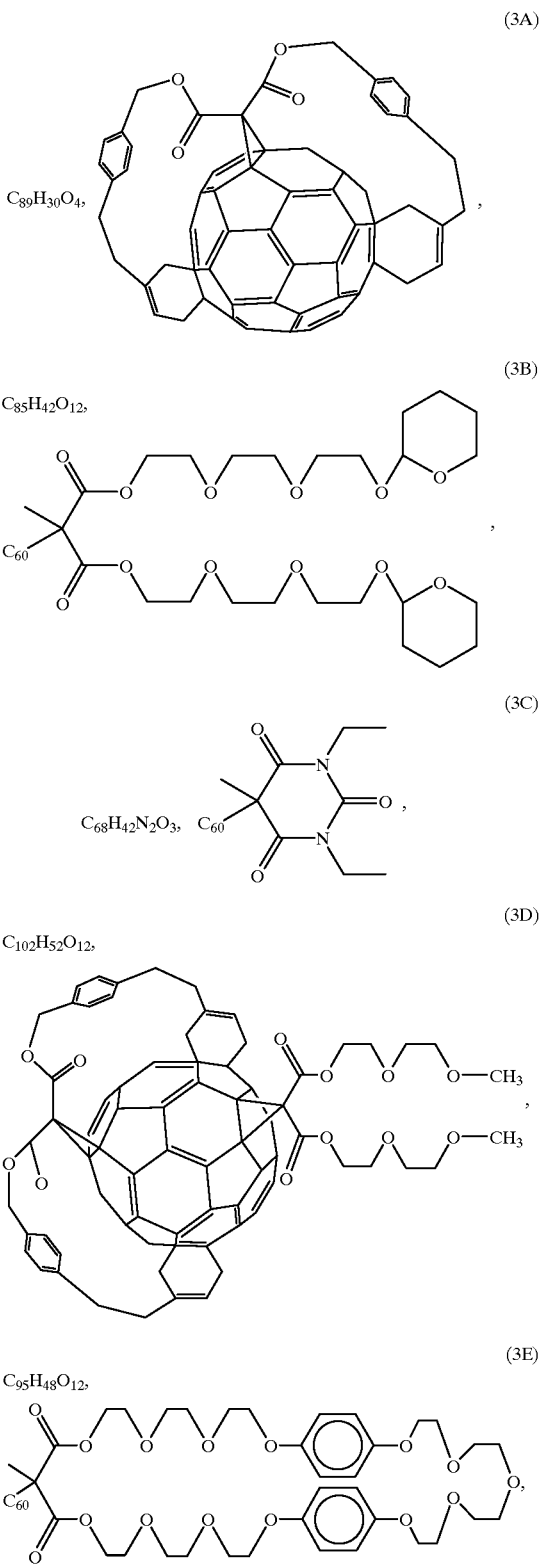

-continued

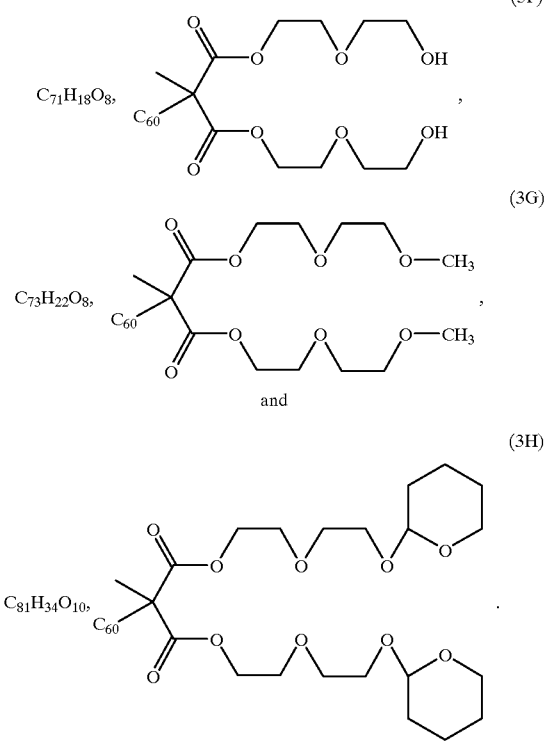

Following is a description for the formation of a patterned resist layer by using the EB resist composition according to the present invention.

In the first place, a uniform thin film containing the methanofullerene compound is formed on the surface of a substrate which is not particularly limitative including those conventional in the fine patterning process for the manufacture of electronic devices such as semiconductor silicon wafers and gallium arsenide compound semiconductor wafers as well as those obtained by forming a coating film of silicon nitride, aluminum, indium oxide, titanium oxide and the like on these semiconductor wafers.

In the formation of a thin film of the methanofullerene compound, the so-called Langmuir-Blodgett method is applicable but, from the practical standpoint for convenience and simplicity, the solution coating method is preferable in which a coating solution is prepared by dissolving the methanofullerene compound in a suitable organic solvent such as chloroform, toluene and monochlorobenzene and the substrate surface is coated with the coating solution, for example, on a spin coater and the solvent is evaporated. The methanofullerene compound used in the present invention has a larger solubility in various organic solvents than the corresponding unmodified fullerene and the viscosity of the solution is also higher than the solution of the corresponding fullerene assuming that the solvent is identical and the concentration of the solution is the same so that a solution suitable for the spin coating method can easily be prepared to give a thin coating film having a thickness, usually, in the range from 1 to 100 nm or even larger as dried.

In the next place, the thus formed thin coating film of the methanofullerene compound on the substrate surface is irradiated patternwise with electron beams scanned according to a desired pattern or through a patterned mask bearing a desired pattern. The optimum irradiation dose of the electron beams depends on various factors including the types of the organic solvent used as a developer. As a rough measure assuming the energy of the electron beams of 20 keV, the irradiation dose should be at least $1\times10^{-4}$ C/cm$^2$ or, preferably, at least $1\times10^{-3}$ C/cm$^2$. The upper limit of the irradiation dose is, though not particularly limitative, $1\times10^2$ C/cm$^2$ or, preferably, 10 C/cm$^2$ from the practical standpoint.

After the patternwise irradiation with electron beams which causes insolubilization of the resist layer in the irradiated areas, the resist layer is subjected to a development treatment with an organic solvent which dissolves away the resist layer in the unirradiated areas. Various kinds of organic solvents can be used as the developer including aromatic hydrocarbon solvents such as benzene, toluene, xylene and ethylbenzene, aliphatic halogenated hydrocarbon solvents such as methylene dichloride, ethylene dichloride, chloroform and carbon tetrachloride and aromatic halogenated hydrocarbon solvents such as monochlorobenzene. These organic solvents can be used either singly or as a mixture of two kinds or more according to need. It is particularly preferable to use monochlorobenzene as the developer in respect of little occurrence of scum on the unirradiated areas after development and high contrast of the patterned images.

The above described patterning process utilizes the newly discovered mechanism that the methanofullerene compound forming the resist layer is at least partly graphitized by the irradiation with electron beams so that the solubility of the resist layer in an organic solvent is greatly decreased. Accordingly, the resist layer in the unirradiated areas is selectively dissolved away in the development treatment with the organic solvent while the resist layer in the areas irradiated to cause insolubilization is left undissolved to leave a patterned resist layer having fidelity to the desired pattern. The development treatment is conducted by the immersion method which is most conventional and convenient but other methods such as brush-out method and spraying method can also be applied.

By virtue of the graphitized structure accomplished by the electron beam irradiation, the thus patterned resist layer has a low sputtering rate against ion bombardment and high chemical stability in a plasma atmosphere containing chlorine or fluorine to exhibit excellent resistance against dry etching so that the patterned resist layer is useful as a mask in a high-precision etching treatment of the substrate surface. The etching treatment of the substrate surface is advantageously undertaken by a process of dry etching, in particular, by the use of an electron cyclotron-resonating plasma (ECR) etching instrument. In this way, very fine patterning with a high aspect ratio can easily be obtained with high resolution.

In the following, the method of the present invention for the formation of a patterned resist layer is described in more detail by way of Examples, which, however, never limit the scope of the invention in any way.

EXAMPLE 1

A solution was prepared by dissolving 17.5 mg of the methanofullerene compound, as expressed by the formula (3A) given before, in 1 ml of chloroform. A semiconductor silicon wafer was coated with this solution on a spin coater at a rotary speed in the range from 600 to 1400 rpm for 100 seconds followed by drying to form a dried coating layer, and the thickness thereof was determined. FIG. 1 of the accompanying drawing is a graph showing the thickness of the thus formed coating layers as a function of the spin coater revolution indicating that a coating layer having a thickness in the range from 50 to 120 nm can be obtained by controlling the spin coater rotary speed.

Figure 2:
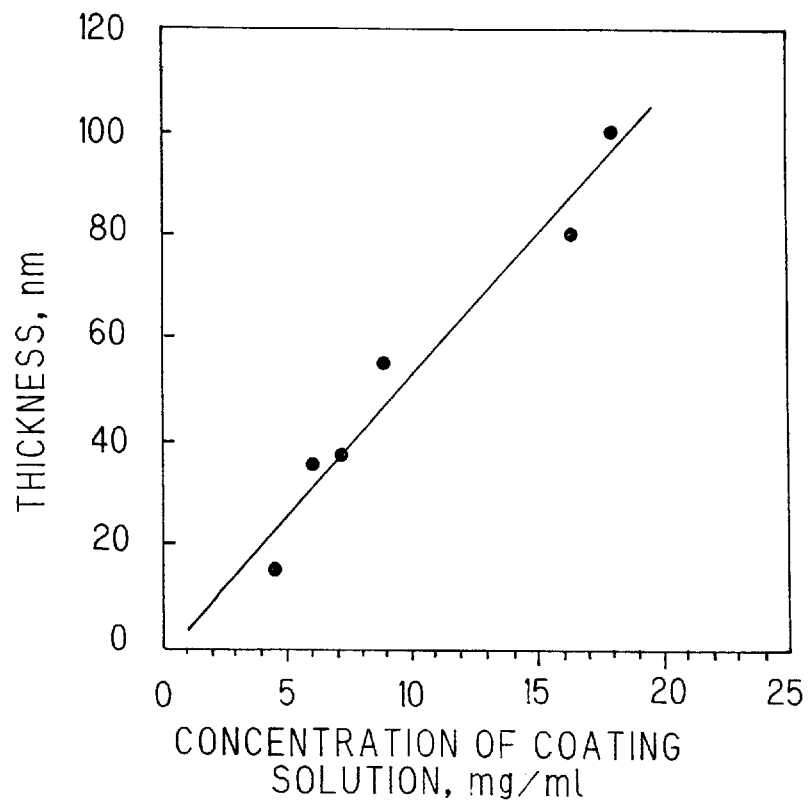
FIG. 2 is a graph showing the thickness of the coating layer formed by spin coating as a function of the concentration of the coating solution determined in Example 1.

In the next place, several chloroform solutions of the same methanofullerene compound as used above were prepared in different concentrations of 4.5 to 18 mg/ml and semiconductor silicon wafers were coated with these coating solutions by the spin coating method under the conditions of 600 rpm and 100 seconds followed by drying to form a dried coating layer, and the thickness thereof was determined. FIG. 2 is a graph showing the thickness of the thus obtained dried coating layers as a function of the concentration of the coating solution. This graph indicates that the thickness of the coating layer is approximately proportional to the concentration of the coating solution.

Figure 3:
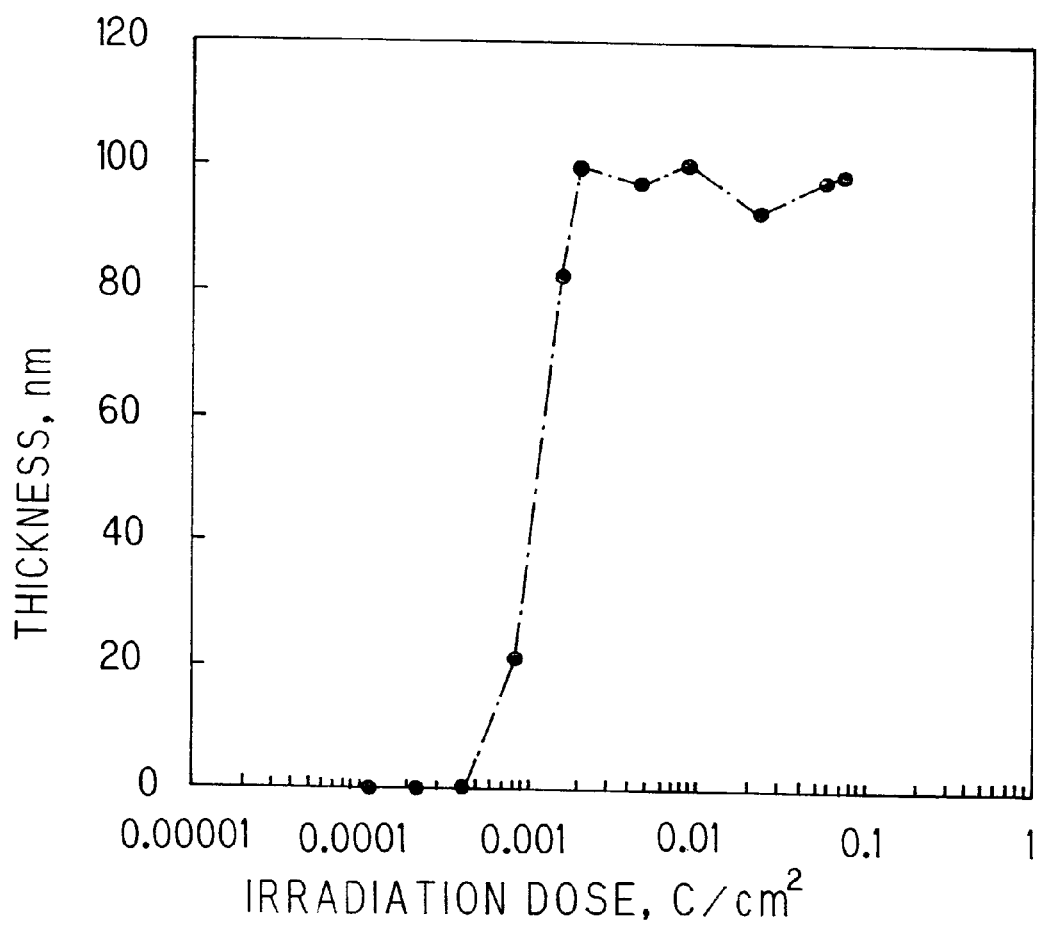
FIG. 3 is a graph showing the film thickness retention after development as a function of the irradiation dose with electron beams on the resist layer determined in Example 1.

Separately, a semiconductor silicon wafer was coated by spin coating with the 17.5 mg/ml chloroform solution of the same methanofullerene compound as used above under the conditions of 1000 rpm of the spin coater revolution for 30 seconds followed by drying to form a dried coating layer having a thickness of about 100 nm. The thus formed coating layer was irradiated patternwise with electron beams of 20 keV energy in an irradiation dose varied in the range from $1\times10^{-4}$ to $1\times10^{-1}$ C/cm$^2$ followed by immersion in monochlorobenzene at room temperature for 60 seconds to effect development and then a rinse with isopropyl alcohol for 10 seconds. After drying with nitrogen gas, the thickness of the coating layer left undissolved in monochlorobenzene, i.e. film thickness retention, was determined to give the results shown in the graph of FIG. 3 as a function of the irradiation dose in a semilogarithmic scale. As is indicated by the graph, insolubilization of the coating layer was almost complete with an irradiation dose of $1\times10^{-3}$ C/cm$^2$ or larger while the coating layer in the unirradiated areas was completely dissolved away.

Taking this critical dose of $1\times10^{-3}$ C/cm$^2$ as a measure of the sensitivity of the layer to electron beam irradiation as an EB resist, the sensitivity of the here employed specific methanofullerene compound is about 10 times higher than that of the $C_{60}$ fullerene compound.

EXAMPLE 2

A 75 nm thick coating layer of the same methanofullerene compound as used in Example 1 was formed on a semiconductor silicon wafer by the spin coating method and the thus formed coating layer was irradiated with electron beams of 20 keV energy on a 100 μm by 150 μm rectangular area in an irradiation dose varied in the range from $3\times10^{-4}$ to $4.4\times10^{-3}$ C/cm$^2$ followed by the development treatment and rinse in the same manner as in Example 1 to form a patterned resist layer, of which the thickness, i.e. film thickness retention, was determined and shown in Table 1 for two different irradiation doses.

With the thus patterned coating layer as a masking resist, the surface of the silicon wafer substrate was subjected to a dry etching treatment for 10 minutes on an ECR instrument with sulfur hexafluoride as the etching gas under a pressure of $3\times10^{-4}$ Torr with application of 250 watts microwave at a frequency of 2.45 GHz for plasma generation and 40 watts high-frequency power of 13.56 MHz to the substrate. By this etching treatment, a 1.7 μm thick surface layer was shaved off from the substrate while the masking resist layer was completely removed leaving a rectangular raised area having a height difference shown in Table 1. These results were used for the calculation of the etching resistance of the resist layer relative to the silicon surface to give the relative etching resistance shown in Table 1 which was larger than 5 for each of the different irradiation doses.

TABLE 1

| | Irradiation dose, $\times10^{-3}$ C/cm$^2$ | |
|---|---|---|
| | 4.365 | 2.183 |
| Film thickness retention, nm | 71.4 | 65.4 |
| Height difference on silicon, nm | 408.5 | 345.2 |
| Relative etching resistance | 5.72 | 5.28 |

For comparison, the same dry etching test was conducted with a commercially available novolak resin-based resist composition (SAL 601, a product by Shipley Co.) known as a resist of relatively high dry etching resistance. Thus, a 300 nm thick resist layer of the novolak resist formed on a semiconductor silicon wafer by spin coating was patternwise irradiated with electron beams of 20 keV energy in an irradiation dose of $2.5\times10^{-5}$ C/cm$^2$ followed by the development treatment and dry etching treatment undertaken in the same manner as above. The relative etching resistance of this resist material to silicon was 3.

The above given experimental results support a conclusion that the resist layer formed from the specific methanofullerene compound has much higher resistance against dry etching than the conventional novolak resin-based resist material to be useful for fine patterning with a high aspect ratio.

EXAMPLE 3

A 70 nm thick coating layer as dried of the same methanofullerene compound as used in Example 1 was formed on the surface of a semiconductor silicon wafer by the spin coating method. The coating layer was irradiated with electron beams of 20 keV energy spotwise along an array of spots in an irradiation dose of $1\times10^{-13}$ C/spot followed by the development treatment and rinse in the same manner as in Example 1 to form a dot-patterned resist layer of which each dot had a diameter of 20 nm.

A dry etching test of the silicon wafer bearing the dot-patterned resist layer was undertaken in the same manner as in Example 2 except that the pressure of the plasma atmosphere was $2\times10^{-4}$ Torr and the duration of the etching treatment was 60 seconds to form pillars each having a diameter of 20 nm and a height of 160 nm standing upright on the silicon surface in an array.

EXAMPLE 4

The procedures for the formation of a patterned resist layer on a silicon surface and the dry etching test were substantially the same as in Example 3 except that the irradiation with electron beams in patterning was conducted along a straight line instead of an array of spots with a linear irradiation dose of $4\times10^{-9}$ C/cm.

As a result of the dry etching treatment, a linear rise having a width of 20 nm and a height of 160 nm standing upright on the silicon surface was obtained.

EXAMPLE 5

Figure 4A:
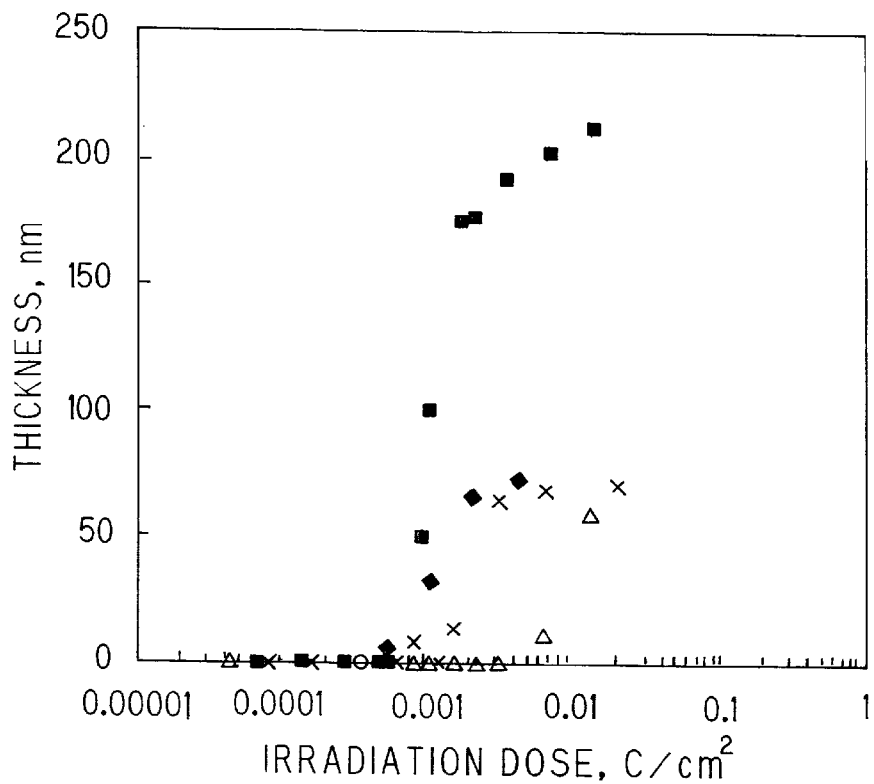
FIGS. 4A and 4B are each a graph showing the film thickness retention after development as a function of the irradiation dose with electron beams on the resist layer of different methanofullerene compounds A, B, C and D and E, F, G and H, respectively, determined in Example 5.
Figure 4B:
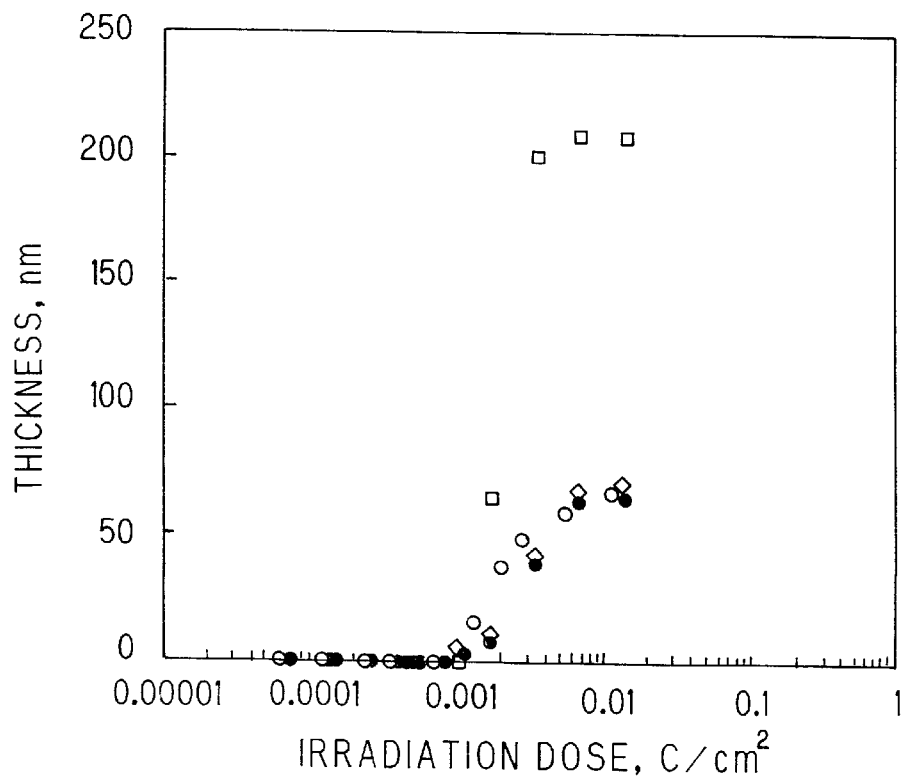

The procedure for the formation of a patterned resist layer on a silicon surface in about the same manner as in Example 1 was repeated by using the methanofullerene compounds having an adduct group as expressed by the structural formulas (3A) to (3H) given before with an electron beam irradiation dose varied in the range from $1\times10^{-4}$ to $2\times10^{-2}$ $C/cm^2$. FIGS. 4A and 4B show the film thickness retention in nm for the methanofullerene compounds (3A), (3B), (3C) and (3D) plotted with marks of ♦,■, Δ and X, respectively, in FIG. 4A and for the methanofullerene compounds (3E), (3F), (3G) and (3H) plotted with marks of ○, ●, ◇ and □, respectively, in FIG. 4B as a function of the irradiation dose.

These figures indicate that the methanofullerene compound of the formula (3B) is superior to the other compounds in the sensitivity to electron beam irradiation with a high contrast, i.e. with an S-shaped curve rising from left to right with a large gradient, so that a particularly high pattern resolution can be expected with this compound which is the most suitable as an EB resist.

COMPARATIVE EXAMPLE

A semiconductor silicon wafer after cleaning with hydrofluoric acid was provided on the surface by the vacuum evaporation method with a 80 nm thick coating layer of a fullerene compound expressed by the formula (4):

(4)

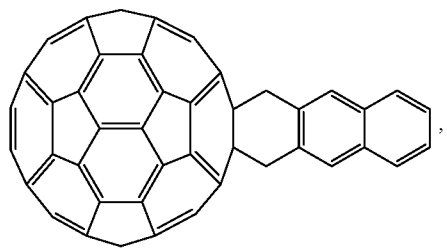

which was a Diels-Alder adduct of $C_{60}$ fullerene.

The thus formed coating layer was patternwise irradiated with electron beams of 20 keV energy in an irradiation dose in the range from $1\times10^{-3}$ to $1\times10^{-1}$ $C/cm^2$ followed by a development treatment and rinse in the same manner as in Example 1 to form a patterned resist layer of which the film thickness retention was determined to give the results shown in FIG. 5 by the curve I as a function of the irradiation dose.

The same experimental procedure as above was repeated excepting for the use of $C_{60}$ fullerene in place of the Diels-Alder adduct and a decrease of the thickness of the resist layer from 80 nm to 60 nm. The film thickness retention as determined is shown in FIG. 5 by the curve II as a function of the irradiation dose.

As is indicated in FIG. 5, each of the $C_{60}$ fullerene and the Diels-Alder adduct thereof was insolubilized in monochlorobenzene by the electron beam irradiation in an irradiation does of $1\times10^{-2}$ $C/cm^2$ or larger. Namely, the sensitivity of these two compounds was approximately identical between them but much lower than the methanofullerene compounds having an oxygen-containing adduct group as proposed in the present invention.

What is claimed is:

1. A method for the formation of a patterned resist layer on a substrate surface by patternwise irradiation with electron beams which comprises the steps of:

(a) coating the substrate surface with a coating solution of a methanofullerene compound dissolved in an organic solvent to form a coating layer;

(b) evaporating the organic solvent from the coating layer to form a dried coating layer containing the methanofullerene compound;

(c) irradiating the dried coating layer patternwise with electron beams; and (d) dissolving away the coating layer with an organic solvent selectively from the areas unirradiated with the electron beams.

2. The method for the formation of a patterned resist layer on a substrate surface as claimed in claim 1 in which the methanofullerene compound has an oxygen-containing adduct group in the molecule.

3. The method for the formation of a patterned resist layer on a substrate surface as claimed in claim 1 in which the methanofullerene compound is selected from the group consisting of the compounds expressed by the structural formulas.

(3A)

$C_{89}H_{30}O_4$,

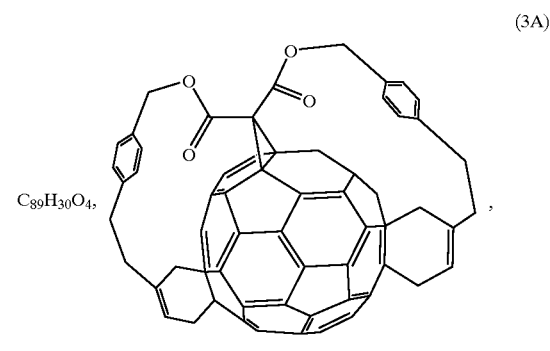

(3B)

$C_{85}H_{42}O_{12}$,

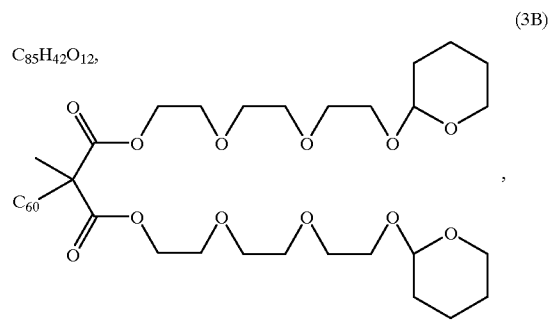

(3C)

$C_{68}H_{42}N_2O_3$, $C_{60}$

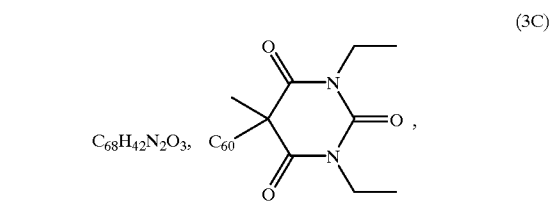

(3D)

$C_{102}H_{52}O_{12}$,

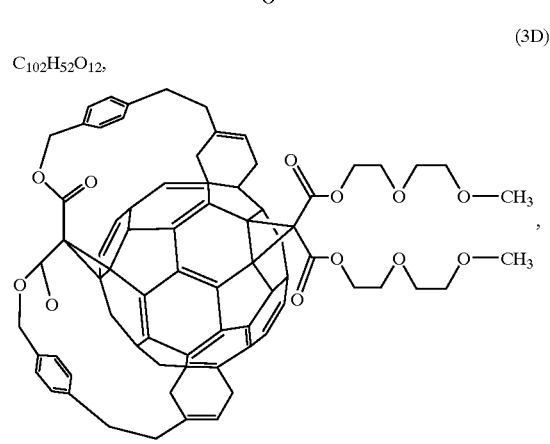

-continued

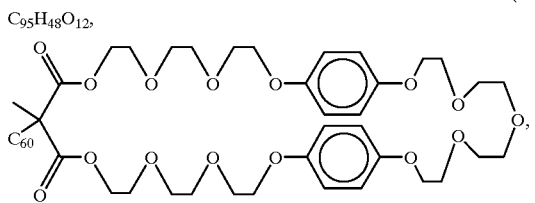

(3E)

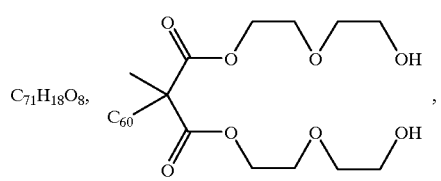

(3F)

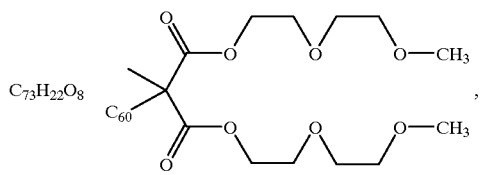

(3G)

and

-continued

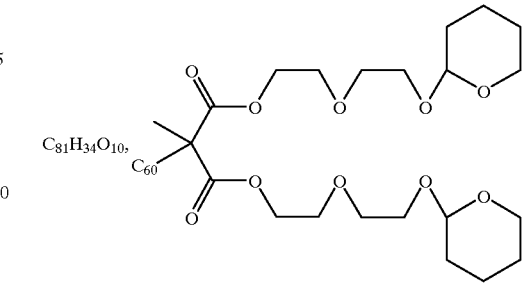

(3H)

4. The method for the formation of a patterned resist layer on a substrate surface as claimed in claim 3 in which the methanofullerene compound is the compound expressed by the structural formula (3A) or (3B).

5. The method for the formation of a patterned resist layer on a substrate surface as claimed in claim 1 in which the organic solvent in the coating solution is selected from the group consisting of chloroform, toluene and monochlorobenzene.

6. The method for the formation of a patterned resist layer on a substrate surface as claimed in claim 1 in which the irradiation of the coating layer with electron beams in step (c) is conducted in an irradiation dose of at least $1\times10^{-4}$ $C/cm^2$.

7. The method for the formation of a patterned resist layer on a substrate surface as claimed in claim 1 in which the organic solvent used in step (d) is selected from the group consisting of aromatic hydrocarbon solvents, aliphatic halogenated hydrocarbon solvents and monochlorobenzene.

* * * * *

UNITED STATES PATENT AND TRADEMARK OFFICE
CERTIFICATE OF CORRECTION

PATENT NO. : 6,117,617
DATED : September 12, 2000
INVENTOR(S) : Toshihiko KANAYAMA et al.

It is certified that error appears in the above-identified patent and that said Letters Patent is hereby corrected as shown below:

On the cover page, the complete name of the fourth inventor should read --Alexander Phillip <u>Graham</u> Robinson--.

On the cover page, the complete name of the first assignee should read --Japan as represented by Director <u>General</u> of Agency of Industrial Science and Technology--.

Column 6, the fourth structural formula (3D) should read:

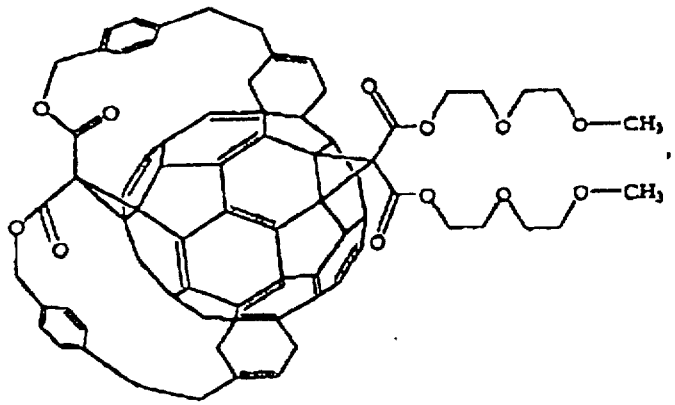

(3D)

$C_{102}H_{52}O_{12}$,

UNITED STATES PATENT AND TRADEMARK OFFICE
CERTIFICATE OF CORRECTION

PATENT NO. : 6,117,617
DATED : September 12, 2000
INVENTOR(S) : Toshihiko KANAYAMA et al.

It is certified that error appears in the above-identified patent and that said Letters Patent is hereby corrected as shown below:

The molecular formula (3E) "$C_{95}H_{48}O_{12}$" at the bottom of column 6 should be --$C_{95}H_{48}O_{15}$--.

In the structural formula (3D), at the bottom of column 12, one of the four carbonyl groups is given with a single bond of -C-O, which should be -C=O as shown in Formula(3D) above.

The molecular formula (3E) "$C_{95}H_{48}O_{12}$" at the top of column 13 should be --$C_{95}H_{48}O_{15}$--.

Signed and Sealed this

Twenty-second Day of May, 2001

*Attest:*

NICHOLAS P. GODICI

*Attesting Officer*  Acting Director of the United States Patent and Trademark Office